United States Patent [19]

Rankin

[11] 3,875,520

[45] Apr. 1, 1975

[54] AUDIO FREQUENCY AMPLIFIER

[76] Inventor: John Charles Rankin, 1304 Sherman Way, North Hollywood, Calif. 91605

[22] Filed: Jan. 14, 1972

[21] Appl. No.: 217,740

[52] U.S. Cl. ........................ 330/10, 330/14, 330/15

[51] Int. Cl. ............................................. H03f 3/38

[58] Field of Search .......................... 330/10, 14, 15

[56] References Cited

UNITED STATES PATENTS

| | | | |
|---|---|---|---|
| 2,878,386 | 3/1959 | Chow et al. | 331/117 |
| 3,038,128 | 6/1962 | Fischman et al. | 331/117 |
| 3,047,736 | 7/1962 | Dornhoefer | 331/117 |
| 3,327,234 | 6/1967 | Grenier | 330/10 |

*Primary Examiner*—John Kominski

[57] ABSTRACT

An audio frequency amplifier in which the output transistors are driven by the detected radio frequency voltage from two overmodulated ocillators. Isolation between the output transistors and preamplifiers is provided by radio frequency transformers so that the output transistors may receive power directly from the power line instead of from a power transformer.

3 Claims, 3 Drawing Figures

AUDIO FREQUENCY AMPLIFIER

This invention relates to transistor amplifiers and more particularly to those used for high fidelity sound, servo amplifiers and switching amplifiers.

With the introduction of power transistors capable of providing 50 to 100 watts of audio power came drive problems which were not encountered with vacuum tubes. The first high power transistors were driven with audio frequency transformers and forward bias was provided by low impedance resistive networks which consumed considerable power. The audio frequency transformers introduced much phase shift and in a high fidelity system they were large and expensive. In some instances the driver transformers were replaced by Darlington connected driver transistors. These driver transistors operate in class A and although the drive requirements for the output transistors are in the order of milliwatts, the dissipation of the drive transistors is in the order of watts and heat sinks are necessary for the driver transistors.

The performance of the Darlington connected drivers is superior to that of the transformer coupled type but the direct coupling makes trouble shooting difficult during manufacture and in the field.

It is an object of this invention to provide an amplifier which offers the isolation and impedance step down available from audio transformer coupling without the necessity for bias networks.

A further object of this invention is to allow the use of small driver transistors which do not require heat sinks.

A still further object of the invention is to provide an amplifier which has no direct coupling between the driver transistors and the output transistors so that the output transistors may be supplied with power directly from the power line to eliminate the necessity of a large power transformer.

Still another object of the invention is to provide an oscillator transformer which may be used with a variety of driver transistors.

A still further object of the invention is to provide an amplifier in which the output transistors may be changed from NPN to PNP types or intermixed without any changes except to reverse the base and emitter connections.

Both the audio transformer coupled types and the Darlington types require power transformers for isolation from the power lines, this is particularly so in the case of Darlington types because of the direct or capacitive coupling.

Prior to this invention, because of the practice of power companies grounding one side of the power lines, audio transformers were necessary for amplifiers with output transistors connected to the power line directly. This also applies to the negative feedback in such circuits and any attempts to apply feedback through high resistances results in hum in the amplifier due to alternating current flow in these high resistances. The use of an audio transformer in the feedback circuit is not practical due to the phase shift which restricts the amount of feedback which can be used. For the reasons outlined, most amplifiers in the fifty to one hundred watt class use large power transformers which are the most costly part of the amplifiers.

The amplifier described herein enables the output transistors to operate on power obtained directly from the power line without using a power transformer except for the preamplifier and reduces the weight and cost of the power transformer 10 times.

In accordance with the invention, an audio frequency signal is applied to the input stage, converted to two signals of opposite phase by the phase inverter and these two signals are used to modulate two oscillators. The oscillators are normally operating at a very low level and the outputs from the phase inverter overmodulate the oscillators. This is not detrimental because only the positive pulses are required from two detectors to drive the NPN type output transistors. In the unmodulated state, both oscillators may be regarded as operating at low level class C and consuming very little power. When the oscillators are driven by the phase inverter, the operation changes to class AB at maximum power and the dissipation is still low, allowing the use of small transistors. The detected output of the unmodulated carrier provides foreward bias for the output transistors to prevent crossover distortion. The output transistors operate in a manner called single ended push pull. Because of the isolation provided by the oscillation transformers it is possible to add a third oscillator transformer in the feedback circuit and obtain power for the output transistors directly from the power line. Because the isolation is provided by radio frequency transformer action and not audio frequency transformer action, phase shift is not a problem and twenty decibels or more of feedback may be used.

Figure 1:
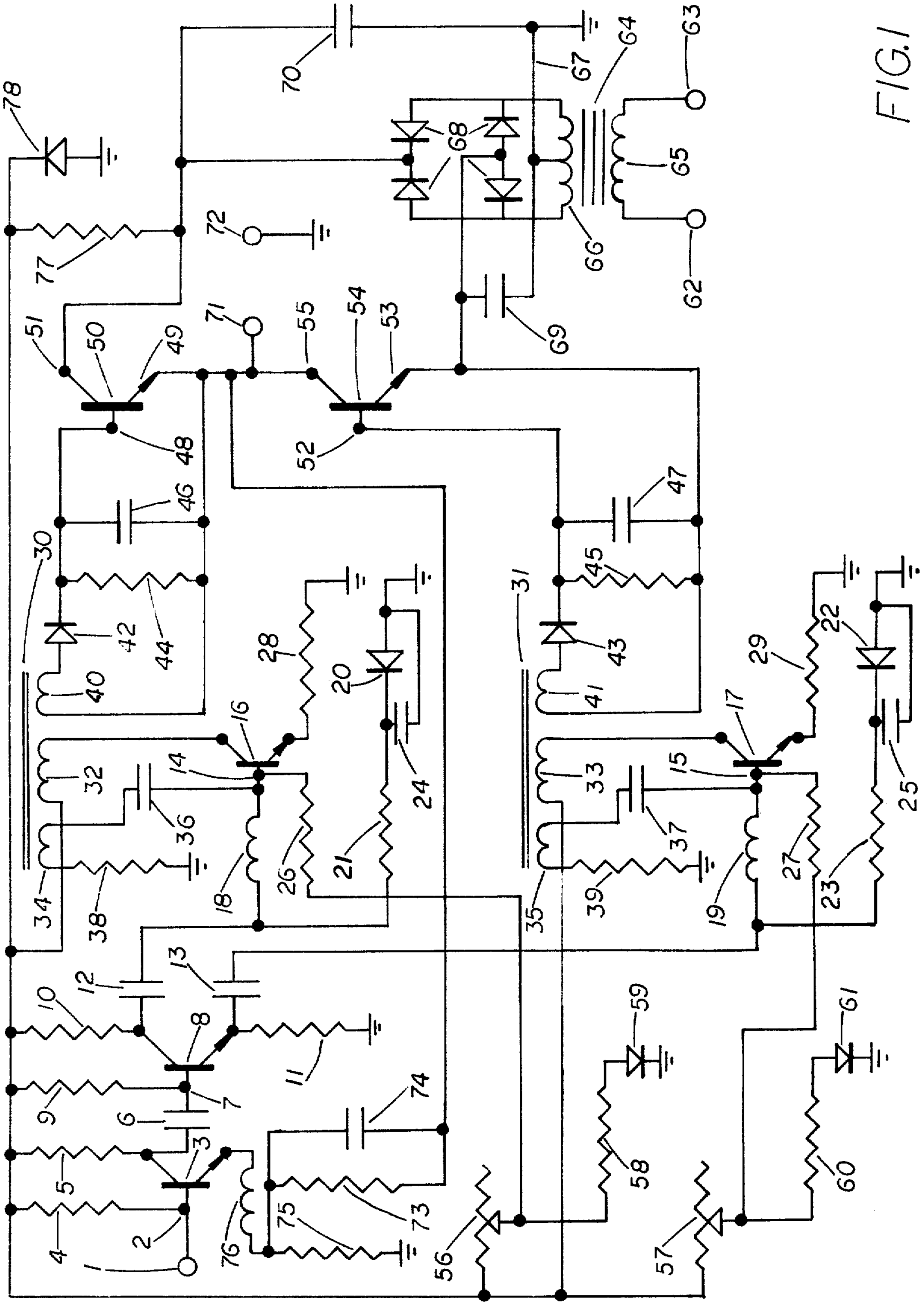
FIG. 1 is a schematic drawing of an amplifier in accordance with the invention. This version uses a power transformer to supply power for the output transistors.

Referring now particularly in FIG. 1, an audio frequency signal is applied between input terminal 1 and ground. The input terminal 1 is connected to the base 2 of transistor 3 with bias supplied through resistor 4. The amplified signal appears across resistor 5 and is coupled through capacitor 6 to the base 7 of transistor 8 with bias supplied through resistor 9. Collector resistor 10 and emitter resistor 11 are equal in value so that the audio voltages appearing across them are equal in value but opposite in phase. These equal voltages are applied through capacitors 12 and 13 to the bases 14 and 15 of transistor oscillators 16 and 17. Radio frequency chokes 18 and 19 prevent the loss of radio frequency voltage from the oscillators 16 and 17 into the phase inverter 8. For minimum distortion at high level, low audio frequencies it is necessary to clamp bases 14 and 15 at ground potential, this is done by diode 20 in series with resistor 21 and diode 22 in series with resistor 23. At high audio frequencies the clamping is not required and due to the circuit time constants, the diodes 20 and 22 place an undesireable increased positive bias on the bases of transistors 16 and 17. This effect is eliminated by capacitors 24 and 25 which effectively short circuit the diodes at the high audio frequencies. Operating forward bias for oscillators 16 and 17 is supplied through resistors 26 and 27. Emitter resistors 28 and 29 increase the base impedance of oscillators 16 and 17 and also compensate for beta differences in transistors. Each of the oscillator transformers 30 and 31 has three windings, oscillation is maintained by coupling between the collector windings 32 and 33 and their respective base windings 34 and 35. Capacitors 36 and 37 couple the radio frequency into the base circuits of oscillators 16 and 17 and resistors 38 and 39 limit the radio frequency base current to allow low distortion modulation from low levels to high levels. Windings 40 and 41 are the oscillator output windings and supply radio frequency voltages to diodes 42 and 43 for detection. The detected voltages appear across load resistors 44 and 45 and are filtered by capacitors 46 and 47. The detected, unmodulated carrier voltage appearing across resistor 44 is applied between the base 48 and emitter 49 of transistor 50 with a positive voltage, from the power supply, applied to the collector 51. In a similar manner, the detected, unmodulated carrier voltage appearing across resistor 45 is applied between the base 52 and emitter 53 of transistor 54 with the collector 55 connected to the emitter 49 of transistor 50. The detected, unmodulated carrier voltage appearing across resistors 44 and 45 is the foreward bias for output transistors 50 and 54. This foreward bias is used in the amplifier to prevent cross over distortion, it may be set to the value required on each output transistor by adjusting variable resistors 56 and 57 which vary the foreward bias on the oscillators 16 and 17. Connected between the arm of variable resistor 56 and ground is the resistor 58 and diode 59. The diode 59 is mounted close to transistor 50 and any increase in temperature of transistor 50 means a corresponding decrease in resistance of diode 59. This decreases the voltage at the arm of variable resistor 56 which decreases the foreward bias on transistor 50. In a similar manner, diode 61 is mounted close to transistor 54 and in conjunction with resistor 60, it varies the voltage at the arm of variable resistor 57 to control the foreward bias of transistor 54 in accordance with the temperature of transistor 54. The power line is connected to the amplifier at terminals 62 and 63 to which is connected a power transformer 64 with a primary winding 65 and a secondary winding 66 with a center tap 67 connected to ground. The four diodes 68 form two full wave rectifiers to provide a negative and a positive supply with the negative supply connected to the emitter 53 of transistor 54. Capacitors 69 and 70 supply the filtering necessary for each supply. When a low level audio signal is applied between terminal 1 and ground, a low level sine wave appears across resistors 44 and 45. The two sine waves are one hundred and eighty degrees out of phase so that when a positive portion of a sine wave on base 48 causes an increase in emitter 49 current, a negative portion of a sine wave appears on base 52 causing a decrease in collector 55 current. These two currents flow in a load connected between terminals 71 and 72. When a high level audio signal is applied between terminal 1 and ground, the phase inverter 8 delivers high level audio voltages to the oscillators 16 and 17 and they are consequently greatly overloaded. The negative portions of the sine waves are clipped to a small fraction of the positive portion but since the negative portion of the sine waves are not used to produce power in a single ended push pull amplifier, the overmodulation with negative clipping does no harm. The overall effect of the overmodulation is beneficial in allowing oscillators 16 and 17 to be three hundred milliwatt transistors in a fifty watt amplifier where previously Darlington type circuits, of similar power outputs, used three watt driver transistors. The use of two overmodulated oscillators also enables independent temperature and foreward bias adjustment of each transistor whereas in neither the audio transformer coupled or Darlington type amplifiers are these two features available together. Negative feedback is applied to the input transistor 3 by the resistor 73 and capacitor 74 connected between terminal 71 and emitter resistor 75. The choke coil 76 compensates for the phase shift of choke coils 18 and 19. Resistor 77 drops the positive voltage to a suitable level for the operation of transistors 3, 8, 16 and 17. The zener diode 78 prevents a large voltage variation due to the large variation in current drawn by the oscillators 16 and 17 with low and high levels of modulation.

A test amplifier of this type has delivered fifty watts RMS within one decibel from twenty hertz to fifteen kilohertz with 0.5% distortion with one volt RMS input.

Figure 2:
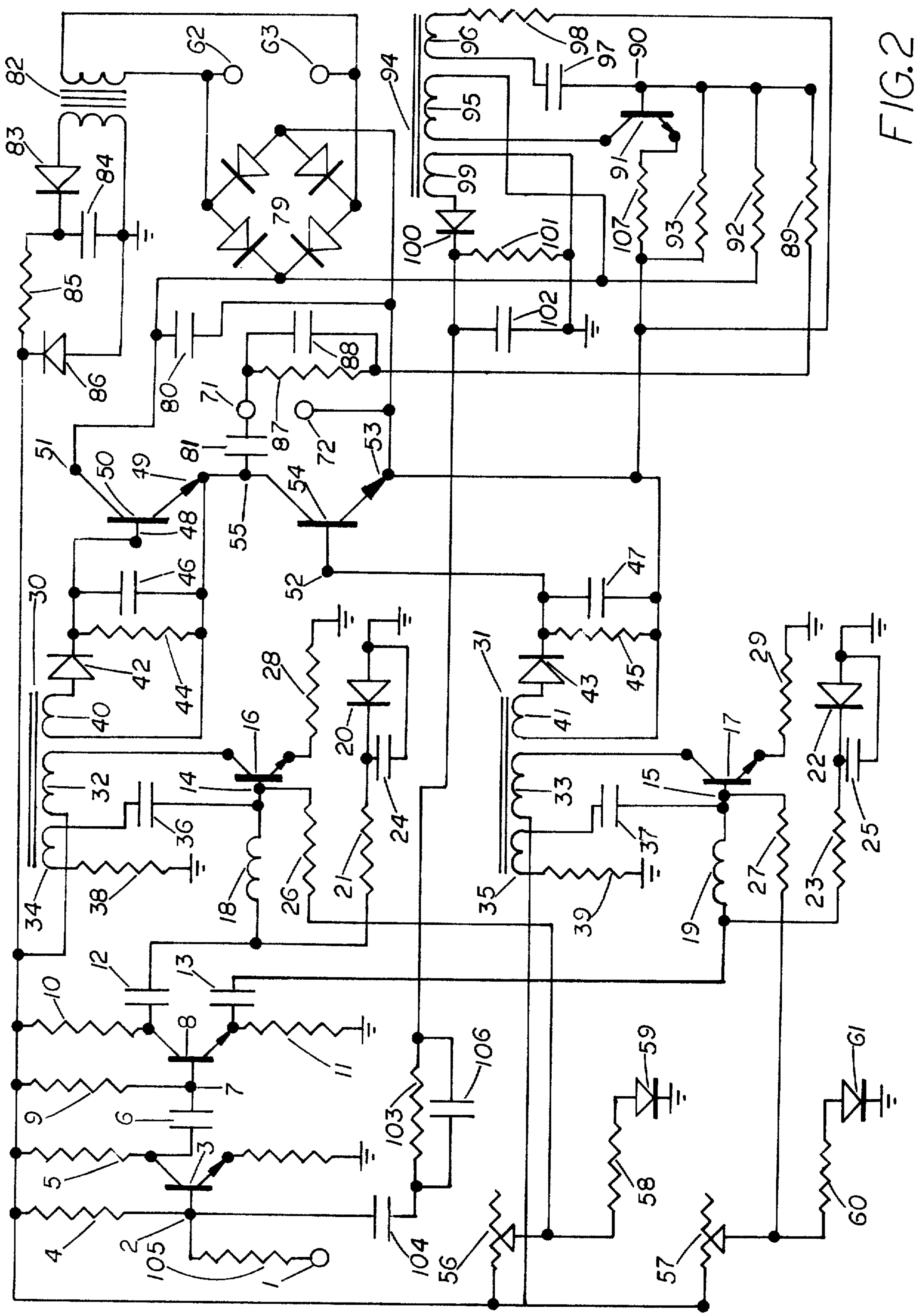
FIG. 2 is a schematic drawing of an amplifier with the output transistors obtaining power from the power line and a small transformer used for the preamplifiers and driver transistors.

Referring now to FIG. 2, the amplifier is shown with the output transistors 50 and 54 receiving power from a bridge type rectifier 79 connected directly to the power line at terminals 62 and 63. The output of the bridge rectifier 79 is filtered by capacitor 80 with the positive side connected to the collector 51 of transistor 50 and the negative side connected to the emitter 53 of transistor 54. Capacitor 81 is inserted between the load terminal 71 and the junction of emitter 49 and collector 55 to prevent a short circuit of direct current at this junction. When an audio frequency signal is applied between the input terminal 1 and ground, the positive pulses applied alternately to the bases 48 and 52 of the output transistors 50 and 54 will cause the capacitor 81 to alternately charge and discharge through a load connected across the load terminals 71 and 72. Power for the input transistor 3, the phase inverter 8 and the two oscillators 16 and 17 is supplied from a small power transformer 82 connected to rectifier 83 and filtered by capacitor 84. The output of this power supply is reduced and regulated by the resistor 85 and the zener diode 86.

Negative feedback for this circuit is applied by using a third oscillator and an oscillator transformer for isolation.

A signal from the load terminal 71 is connected through a phase correcting network consisting of resistor 87 and capacitor 88 and through the isolating resistor 89 to the base 90 of oscillator transistor 91. Resistor 89 performs the function of a radio frequency choke to prevent radio frequency from the oscillator 91 from being fed back to the load across terminals 71 and 72. Foreward bias for the oscillator 91 is supplied by resistors 92 and 93. The oscillator transformer 94 consists of three windings, winding 95 is coupled to winding 96 to maintain oscillation and capacitor 97 couples the voltage of winding 96 to the base 90. Resistor 98 limits the radio frequency current in the base circuit to achieve low distortion modulation. The third winding 99 is the output winding and is coupled to windings 95 and 96. The output of winding 99 is detected by diode 100 with the detected voltage appearing across resistor 101 and filtered by capacitor 102. In the case of anamplifier delivering fifty watts into an eight ohm load across terminals 71 and 72, the audio voltage across terminals 71 and 72 will be twenty volts. Resistor 87 reduces this voltage to a satisfactory level to apply to the base 90 of transistor 91. Capacitor 88 compensates for capacitance between base 90 and ground. Oscillator 91 operates at a higher level than oscillators 16 and 17 because oscillator 91 detector must produce a full sine wave output. The audio voltage across resistor 101 is applied through resistor 103 and capacitor 104 to the base 2 of transistor 3. Resistor 105 is inserted in between base 2 and terminal 1 to prevent the input source from short circuiting the feedback voltage. Capacitor 106 compensates for the phase shift caused by resistor 103 and the capacitance between base 2 of the input transistor 3 and ground. Resistors 38, 39 and 98 are very important parts of the invention and they have an optimum value for minimum distortion. The value of each resistor is between 100 and 1000 ohms and the use of the resistor enables transistor 91 to supply one volt RMS across resistor 101 with 0.2% harmonic distortion. Resistor 107 in the emitter of oscillator 91 is used for negative feedback to compensate for variation in the value of the beta of transistors.

The two main features of the invention are:

1. The use of overmodulation.
2. The design of the oscillator transformer.

Figure 3:
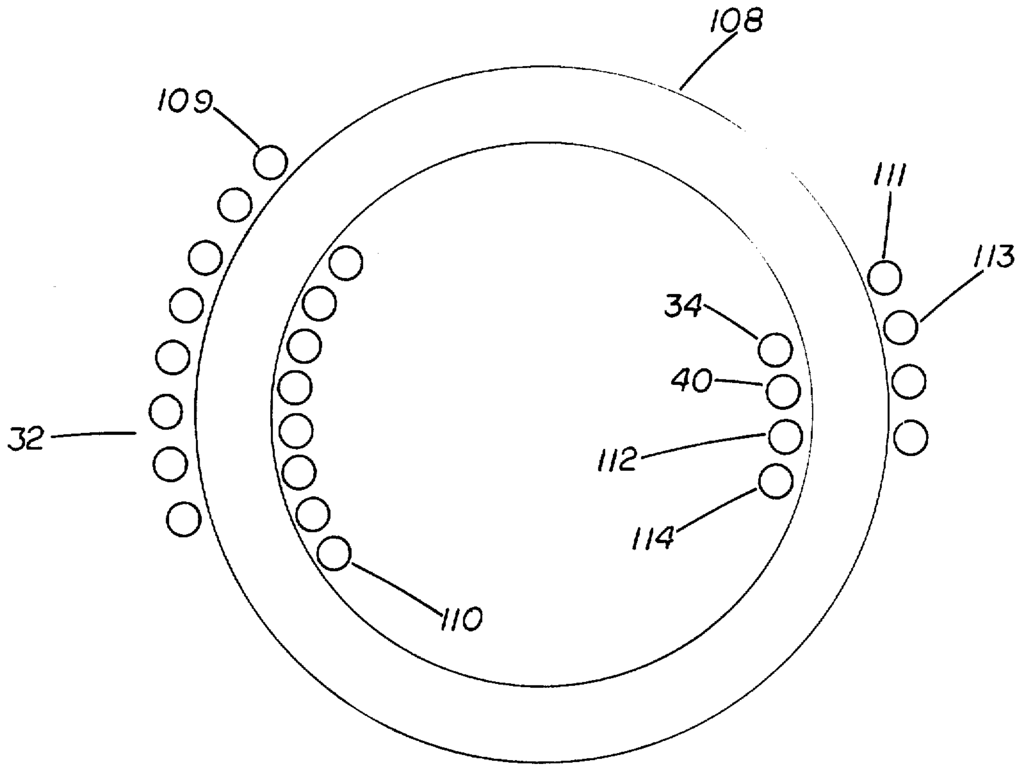
FIG. 3 is a winding diagram of an oscillator transformer.

Referring to FIG. 3 which shows a winding diagram of the transformer consisting of three windings 32, 34 and 40 wound on a special type of ferrite core 108, The oscillation frequency is normally between five and ten megahertz depending on stray capacitance and the exact frequency is not important to the operation of the amplifier.

The ferrite core is used to obtain adequate coupling between the three windings. Adequate coupling cannot be obtained with air core transformers without the use of critical tuned circuits. A powdered iron toroidal core will not produce enough coupling due to the low permeability of this material.

The initial permeability of ferrites ranges from about five to over five thousand and the usable frequencies are inversely proportional to the initial permeabilities. The permeability of ferrites may be predicted by controlling components such as aluminum, copper, magnesium, manganese and lithium mixed with ferrous oxide.

A most satisfactory transformer for the invention uses a core made from a mixture of nickel, zinc and ferrous oxides to produce an initial permeability between fifty and one hundred and fifty.

If higher permeability cores are used for the oscillators, the coupling between transformer windings is increased but the oscillation frequency is decreased which means that the choke coils 18 and 19 in FIG. 1 must increase in inductance which increases the phase shift of the amplifier. Also, with a lower oscillation frequency, capacitors 46 and 47 have to be increased in value which further adds to the phase shift. With a lower oscillation frequency, capacitors 36 and 37 must be increased in value to couple the correct voltage to the bases 14 and 15 of the oscillators 16 and 17 and this contributes to additional phase shift. If the permeability of the core is lower than the range specified previously, it becomes increasingly difficult to obtain adequate coupling between the windings and adequate coupling is not only necessary for power transfer between the collector winding 32 and output winding 40 but is is necessary to have adequate coupling to obtain a low distortion output from a modulated transistor oscillator.

For minimum distortion it is necessary that windings 34 and 40 be wound bifilar fashion. The wire size is not a critical factor, neither is the size of the ferrite core, a satisfactory core is one that is ½ inch long and ¼ inch in diameter. This core may be cut in half so that it is one quarter inch long and with the same number of turns, it will operate in a similar manner.

The turns ratio is a very important factor, this ratio being four to one to one, with the largest number of turns on the collector winding 32. If this ratio is maintained, such as eight turns for the collector winding 32 and two turns each for the windings 34 and 40, a wide variety of transistors may be used as oscillators with minimum distortion. This applies to the two overmodulated oscillators 16 and 17 and also the modulated oscillator 91 where the three oscillator transformers 30, 31 and 94 may be identical.

FIG. 3 shows winding 32 with the start 109 and the finish 110. Winding 34 is shown with the start and finish indicated as 111 and 112 with the start and finish of winding 40 being 113 and 114. If the finish 110 of winding 32 were to be continued for an additional half turn on the core 108 no additional voltage would appear across winding 32 because no flux of any measureable amount would cut this half turn. The flux in the core is concentrated inside the core and it is at a minimum on the surface so the half turn is of no consequence and may be considered as lead length. If the finish 110 were continued to make a full additional turn then the difference in distortion would be measureable. From the above it will be seen that removing a half turn is similar to removing a whole turn and this increases distortion. Removing or adding turns to windings 34 or 40 is obviously more critical because of the smaller number of turns. The turns ratio of four to one to one holds with core types other than toroids and it is essential for satisfactory operation of the invention.

One adverse property of the core material is that it tends to saturate easily. This effect may be seen by removing the connection from the base of transistor 50 and with an oscilloscope, observe the pulse across resistor 44. With a large signal at the input terminal 1 the positive portion of a sine wave will be seen, but if the diode 42 is reversed, a very distorted negative portion of a sine wave will be seen. For this reason it is essential that the output windings 40, 41 and 99 be connected to diodes 42, 43 and 100 so that the current flow in the diodes produces a flux to oppose the flux produced by the current flow in the collector windings 32, 33 and 95.

From the foregoing description of the invention, many of the novel features will be apparent, some of which are listed below.

Because the output transistors 50 and 54 obtain foreward bias from the isolated windings 40 and 41, it is possible to replace NPN types with PNP types, in the same amplifier with a minimum of changes.

It is possible to interchange the connections from the load resistors 44 and 45 to transistors 50 and 54 for a reversal of feedback phase.

It is possible to replace one NPN output transistor only with a PNP type with a small change in connections.

The operation of the output transistors without a power transformer, removes the power restrictions imposed by the capability of the power transformer and very large audio power is now available from an economical amplifier.

The use of a modulated oscillator in the feedback circuit of the amplifier of this invention or in the feedback circuit of an audio transformer coupled amplifier, not only provides isolation with the oscillator transformer but it also provides a method of reversing the feedback phase by reversing the detector diode. The ability to reverse feedback phase if oten beneficial to the designer and in many instances, in amplifiers where it is not possible to reverse feedback phase, it is necessary to add an amplifier stage in order to apply feedback.

Modulated oscillated oscillators have been used on many previous occasions, to obtain audio frequency amplification. Such amplifiers often became complex due to such requirements as neutralization of unwanted radio frequency voltages or the need for opposing voltages to balance detected carriers. The use of overmodulation in my invention introduces a new and different aspect to audio frequency amplification by the use of radio frequency and it allows direct coupling from the detectors to the output transistors with an automatic provision of adjustable foreward bias.

While particular embodiments of the present invention have been shown and described, it is apparent that various changes and modification may be made. One such change would be to use only one oscillator connected to two radio frequency amplifiers and to modulate the amplifiers in place of two modulated oscillators.

Since the identity of a square wave is not lost if the top or bottom portion is not transmitted, it is apparent that one overmodulated oscillator and one output transistor would perform satisfactorily in switching circuits presently using Darlington circuits.

It is also possible to use an additional amplifier between each detector output and each output transistor and achieve many of the benefits afforded by the overmodulated oscillators.

What I claim is:

1. An audio frequency amplifier consisting of a first oscillator which includes a first tank circuit with a first secondary winding with one end of said first secondary winding connected to one terminal of a first diode detector and the second terminal of said first diode detector connected to one terminal of a first load resistor and the second terminal of said first load resistor connected to the second end of first secondary winding with said first load resistor connected between the base and emitter of the first transistor of a single ended push pull output stage, a second oscillator which includes a second tank circuit with second secondary winding with one end of said second secondary winding connected to one terminal of a second diode detector and the second terminal of said second diode detector connected to one terminal of a second load resistor and the second terminal of said second load resistor connected to the second end of said second secondary winding with said second load resistor connected between the base and emitter of the second transistor of said single ended push pull stage, means for applying the audio signal to be amplified to the base and emitter of said first and said second oscillators to amplitude modulate and overmodulate each said first and and said second oscillator thereby the detected voltage across said first load resistor is one half of the said audio signal sine wave and the detected voltage across said second load resistor is the second half of said audio signal sine wave with the two said halves of the said audio signal sine wave combining as a sine wave at the output terminal of said single ended push pull stage.

2. An amplifier as defined in claim 1 in which foreward bias current applied between said base and said emitter of said first transistor of said single ended push pull stage is obtained from the voltage developed across said first load resistor by the unmodulated carrier of said first oscillator, with the foreward bias current applied between said base and said emitter of said second transistor of said single ended push pull stage obtained from the voltage developed across said second load resistor by the unmodulated carrier of said second oscillator.

3. An amplifier as defined in claim 1 wherein negative feedback to be applied from said output terminal of said single ended push pull stage to the input of said amplifier is applied by connecting the voltage from said output terminal to the base of a third transistor oscillator which includes a third tank circuit and a third secondary winding with one end of said third secondary winding connected to one terminal of a third diode detector and the second terminal of said third diode connected to one terminal of a third load resistor and the second terminal of said third load resistor connected to the second end of said third secondary coil whereby the voltage from the said output terminal amplitude modulates the said third oscilator and the detected voltage across said third resistor is applied to the input terminals of said amplifier as a negative feedback voltage.

* * * * *